United States Patent [19]

Matsumoto et al.

[11] Patent Number: 5,367,259
[45] Date of Patent: Nov. 22, 1994

[54] ACTIVE SHIELDING DEVICE BASED ON SQUID AND FEEDBACK THEREFROM FOR THE REDUCTION OF ENVIRONMENTAL MAGNETIC NOISE

[75] Inventors: Kazutake Matsumoto; Atsushi Wakusawa; Koji Fujioka, all of Tsukuba, Japan

[73] Assignee: Hoxan Corporation, Sapporo, Japan

[21] Appl. No.: 881,795

[22] Filed: May 12, 1992

[30] Foreign Application Priority Data

May 13, 1991 [JP] Japan .................................. 3-137175

[51] Int. Cl.$^5$ .......................................... G01R 33/035
[52] U.S. Cl. .................................. 324/248; 505/846
[58] Field of Search ........................ 324/248; 307/306; 505/845, 846

[56] References Cited

U.S. PATENT DOCUMENTS 4,327,498  5/1982  Setter et al. ........................... 324/225
4,663,590  5/1987  Gershenson et al. ................ 324/248
5,248,941  9/1993  Lee et al. ............................. 324/248

*Primary Examiner*—Walter E. Snow
*Attorney, Agent, or Firm*—Jacobson, Price, Holman & Stern

[57] ABSTRACT

A magnetic noise reducing device can effectively produce a practically noiseless space that can reduce environmental magnetic noise harmful for measuring biomagnetism with a high magnetism damping factor in low frequency range. The magnetic noise reducing device comprises a SQUID flux meter 1 and a pair of noise canceling coils 2 as minimum components, the feedback current I produced by the SQUID flux meter 1 being supplied to the noise canceling coils 2, the magnetic flux detecting coil of the SQUID flux meter being arranged within a specific central space 4 defined by the noise canceling coils 2 for effective reduction of magnetic noise within that space.

4 Claims, 5 Drawing Sheets

3400 pT 20 sec 34 pT 20 sec

ACTIVE SHIELDING DEVICE BASED ON SQUID AND FEEDBACK THEREFROM FOR THE REDUCTION OF ENVIRONMENTAL MAGNETIC NOISE

BACKGROUND OF THE INVENTION

1. Field of Industrial Use

This invention relates to a magnetic noise reducing device for reducing the magnetic noise level and improving the S/N ratio in a setting for measuring the biomagnetism of a living body having a very low magnetic level in order to improve the reliability of the outcome of the measurement.

2. Prior Art

Reduction of the environmental magnetic noise level and improvement of S/N ratio is a serious concern in the measurement of the biomagnetism of a living body using a SQUID flux meter.

As illustrated in FIG. 2(A) of the accompanying drawings, the environmental magnetic noise is correlated with $1/f$ (f=frequency) in the low frequency range, showing a level between $1 \times 10^{-10}$ and $1 \times 10^{-9}$ $T(Hz)^{-\frac{1}{2}}$ for the frequency of 1 Hz and a higher level for lower frequencies. On the other hand, the level of the biomagnetism of a living body to be detected is found between $10^{-14}$ and $10^{-9}$ (depending on the intensity, the depth, the direction of emission of the signal generating source).

The frequency bandwidth (B) involved in the measurement of biomagnetism is normally around DC to 1 kHz. Since the noise level in a setting for measuring the biomagnetism of a living body is expressed by Bnx B$^{\frac{1}{2}}$ (where Bn is magnetic noise per unit frequency), it will be approximately thirty two (32) times as large as that of $1 \times 10^{-9}$ $T(Hz)^{-\frac{1}{2}}$ for DC to 1 kHz. Besides, the frequency characteristics of the noise involved need to be taken into consideration. If the noise level is of a magnitude of $5 \times 10^{-9}$ T and a magnetic attenuation in the order of $10^{-14}$ is involved, the S/N ratio will be 1 for a signal of $10^{-14}$.

In view of the above facts, a magnetic noise reducing device is required to have a magnetism damping factor of $10^5$ to $10^6$ and be specifically effective for low frequency noises (less than 1 Hz) if it is effectively used for measuring biomagnetism.

Known means for reducing magnetic noise and means for canceling environmental magnetic noise include the followings.

a) magnetic shield room

This is a room constructed by using magnetically highly permeable materials such as Permalloy and providing magnetic noise damping areas inside the room.

FIG. 5 is a graph showing the frequency dependency of the magnetism damping factor of such a magnetic shield room. In FIG. 5, curves L$_1$ and L$_2$ show the magnetic damping factors of two magnetic shield rooms prepared by using walls having a multi-layered structure of aluminum and Permalloy plates. The magnetic damping factor of such a room is increased as the number of aluminum and Permalloy layers grows.

As is obvious from FIG. 5, such a magnetic shield room does not show a large magnetism damping factor for low frequency magnetic noise. Moreover, such a room inevitably provide only a narrow closed space for measurement and entails a high building cost of several hundred million yen.

b) electric method for canceling magnetic noise

This is a method using a device as illustrated in FIG. 6 to eliminate the noise component of output signal by determining the difference between the measurement of a signal detecting SQUID flux meter SC1 and that of a reference SQUID flux meter SC2. In FIG. 6, arrow M denotes signal, arrow N denotes noise, P1 and P2 denote controllers, Q and R respectively denote a signal processing circuit and the output terminal of the circuit.

Since such a device does not and cannot remove the magnetic field existing in the signal detecting space, corrective means may be additionally required for each of the channels involved if a multi-channel SQUID system is used.

c) gradiometer

As is known, a SQUID flux meter normally comprises a magnetic flux transformer constituted by a magnetic flux detecting coil MC, an input coil IP and a SQUID inductance SI as illustrated in FIG. 7. If the spatial gradient is known for the magnetic field to be detected, the gradiometer to be used for magnetic noise reduction are so designed that any magnetic fields having a gradient lower than it may be canceled.

If a magnet meter U, a primary differential gradiometer U1 and a secondary differential gradiometer U2 are arranged as illustrated in FIG. 8 to form a gradiometer for the purpose of magnetic noise reduction, such a gradiometer can selectively cancel even magnetic fields (primary differential) and/or magnetic fields up to the primary gradient (secondary differential) on site or produce $\delta Bz/\delta x$, $\delta Bz/\delta y$ and/or $\delta Bx/\delta z$ according to the purpose of measurement.

A gradiometer as described above is, however, accompanied by the disadvantage of a low sensitivity of a SQUID flux meter for magnetic flux density of higher orders, the sensitivity being remarkably lowered in terms of distance (in the Z direction for $\delta Bz/\delta z$) so that the canceling efficiency is determined by the winding balance, making the rate of noise reduction normally as poor as $10^2$ to $10^4$.

Contrary to the above described disadvantages of known magnetic noise reducing devices, a magnetic noise reducing device according to the invention is based on the principle of nil magnetic field detection that has been used for SQUID flux meters comprising a SQUID circuit having a feedback loop for making a SQUID element always show a nil magnetic field intensity. In other words, in a magnetic noise reducing device according to the invention, the feedback current of each SQUID flux meter it comprises is supplied not to a SQUID element but to corresponding noise canceling coils, the magnetic flux detecting coil of the SQUID flux meter being arranged within a given space defined by the surrounding noise canceling coils in order to operate the said magnetic flux detecting coil as a zero-level detecting coil so that said space defined by the noise canceling coils provides a space that can be effectively shut out magnetic noise.

More specifically, according to the present invention, there is provided a magnetic noise reducing device comprising an appropriate number of noise canceling coils and corresponding matching SQUID flux meters each having a magnetic flux detecting coil arranged within a specific space defined by the corresponding noise canceling coils, the output of each of said SQUID flux meter being supplied to said corresponding noise canceling coils as a feedback current.

Thus, with a magnetic noise reducing device according to the invention, a feedback current is supplied to a number of noise canceling coils not from an ordinary feedback circuit but from the corresponding SQUID flux meter.

Since the magnetic flux detecting coil of each of the SQUID flux meters is arranged within a magnetic space defined by the corresponding noise canceling coils, it operates as a nil detector. Thus, the noise canceling coils can provide a zero-magnetism space within a given space regarding the environmental magnetic noise.

Now, the present invention will be described in greater detail by referring to the accompanying drawings that illustrate preferred embodiments of the invention.

DETAILED DESCRIPTION OF THE EMBODIMENTS

Firstly, some aspects of the spatial properties of environmental magnetic noise will be described. The intensity of magnetic field produced by the source of magnetic noise is expressed in terms of distance by a differential polynomial of 0th to nth order. When, however, the distance between the noise source and the space of measurement is very large, the intensity of magnetic field can be regarded as substantially even (0th) within the space.

While sources of magnetic noise are normally located very far from the space of measurement, they are not identifiable. Therefore, the intensity of magnetic field in the space of measurement can be expressed only by using a differential polynomial of an order higher than 0th. Thus, a magnetic noise reducing device according to the invention utilizes a combination of a SQUID flux meter designed to detect a magnetic field involving an appropriate order (e.g., one as shown in FIG. 8) and a number of noise canceling coils that produce a magnetic space of a corresponding order in order to accommodate existing noise spaces.

Figure 8:
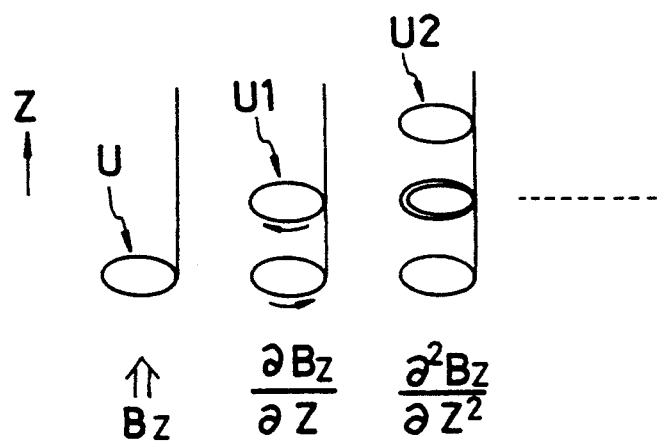
FIG. 8 is a schematic illustration showing the principal components of a known gradiometer.

For instance, a magnet meter (0th) as illustrated in FIG. 8 to be used for the magnetic flux detecting coil of the SQUID flux meter and Helmholtz coils to be used for the noise canceling coils may provide a suitable combination for removing the 0th order component of the magnetic field. A different combination may likewise provide a magnetic noise reducing device appropriate for removing magnetic noise of higher orders.

Now, a preferred first embodiment of the magnetic noise reducing device of the invention comprising a SQUID flux meter 1 and a pair of noise canceling coils 2 that are Helmholtz coils will be described by referring to FIG. 1(A). Reference numeral 3 in FIG. 1(A) denotes a magnetic flux detecting coil of the SQUID flux meter 1 arranged within a given central space 4 formed between the pair of Helmholtz coils which are located in parallel with each other with a given distance separating them in such a manner that said magnetic flux detecting coil 3 is coaxial with the Helmholtz coils.

While the noise canceling coils 2 produces an even magnetic field showing no magnetic gradient, such a magnetic field is possible to exist only within a given limited central space. A larger even magnetic field can be produced only by using larger coils for the noise canceling coils 2. For application of this embodiment, it is assumed that the noise to be eliminated is generated by noise sources located considerably far away from the embodiment and arranged along the axis of the coils. Such a device, therefore, may be called a uniaxial device.

Figure 1A:
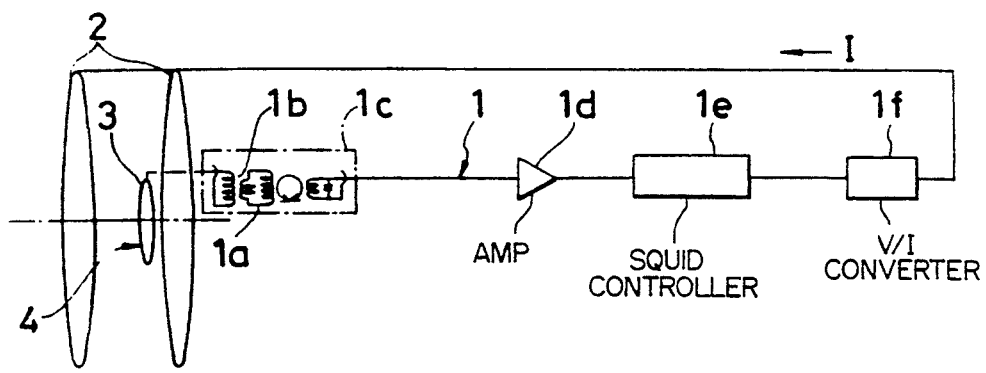
FIGS. 1(A) and 1(B) are circuit diagrams of two different embodiments of the invention.

Referring to FIG. 1(A), $1b$ denotes a magnetic flux transformer inserted between the magnetic flux detecting coil and an input coil $1a$ of a known type and $1c$ denotes a SQUID element of a type normally used for a SQUID flux meter 1. A preamplifier $1d$, a SQUID controller $1e$ and a voltage-current converter $1f$ are serially arranged in the above order to the output side of the SQUID element $1c$ so that the output of the voltage-current converter $1f$, or a feedback current I, is supplied to the Helmholtz coils that constitute noise canceling coils 2 and are arranged in a coaxial relationship with the magnetic flux detecting coil 3.

Figure 1B:
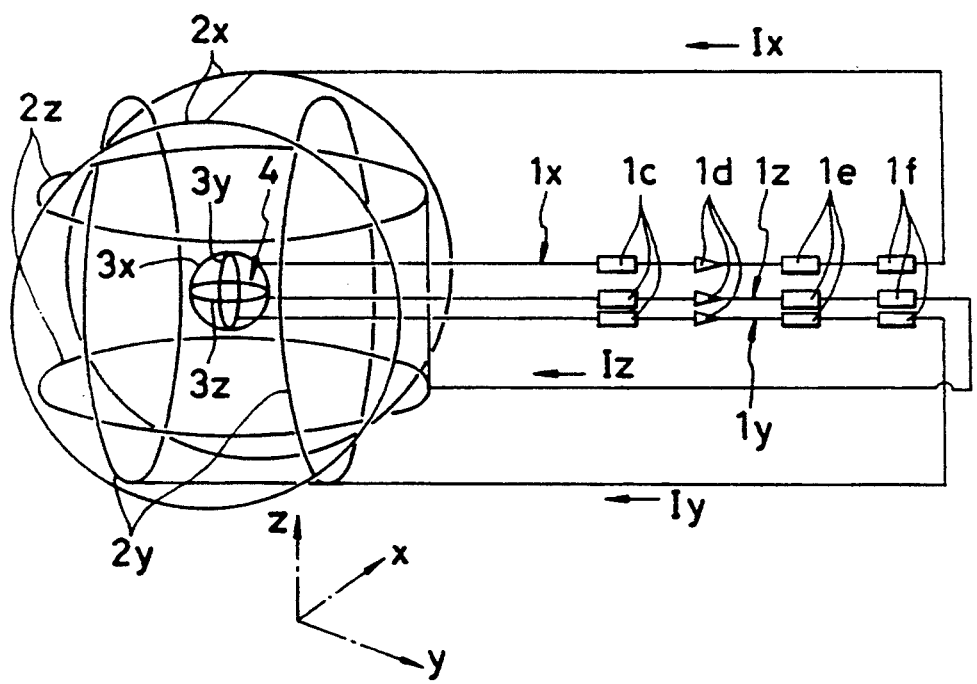

While the embodiment of FIG. 1(A) is only effective for eliminating magnetic noise of 0th gradient along a single common axis of a pair of Helmholtz coils, the embodiment of FIG. 1(B) comprises three pairs of Helmholtz coils $2x$, $2y$, $2z$ arranged along respective axes x, y, z and corresponding SQUID flux meters $1x$, $1y$, $1z$ for the respective Helmholtz coils $2x$, $2y$, $2z$ so that feedback currents Ix, Iy, Iz of the respective SQUID flux meters are supplied to the Helmholtz coils $2x$, $2y$, $2z$ respectively, the magnetic flux detecting coils $3x$, $3y$, $3z$ of the respective SQUID flux meters $1x$, $1y$, $1z$ being arranged in a given central space 4 defined by the Helmholtz coils $2x$, $2y$, $2z$.

With such an arrangement, the embodiment can produce a magnetically shielded three dimensional space generated by the three magnetic flux detecting coils $3x$, $3y$, $3z$ and three Helmholtz coils $2x$, $2y$, $2z$.

In the above described embodiment for producing a magnetically shielded three dimensional space, the magnetic flux detecting coils $3x$, $3y$, $3z$ may have any angular relationship with the respective Helmholtz coils $2x$, $2y$, $2z$ (provided that the axes of the coils $3x$ $2x$ rectangularly cross with each other). Therefore, the magnetic flux detecting coils $3x$, $3y$, $3z$ may take any appropriate positions.

This fact advantageously means that the magnetic flux detecting coils used for measuring the biomagnetism of a subject may take any form and assume an angular orientation.

In an experiment conducted by using the embodiment of FIG. 1(A), the magnetic flux detecting coil of the SQUID flux meter 1 was a magnet meter having five turns and a diameter of 24 mm and each of the Helmholtz coils had 72 turns and a diameter of 1,590 mm in order to accommodate feedback current I up to ±7 mA. The magnitude of the effective magnetic field for noise cancellation was 560 nT.

Figure 2A:
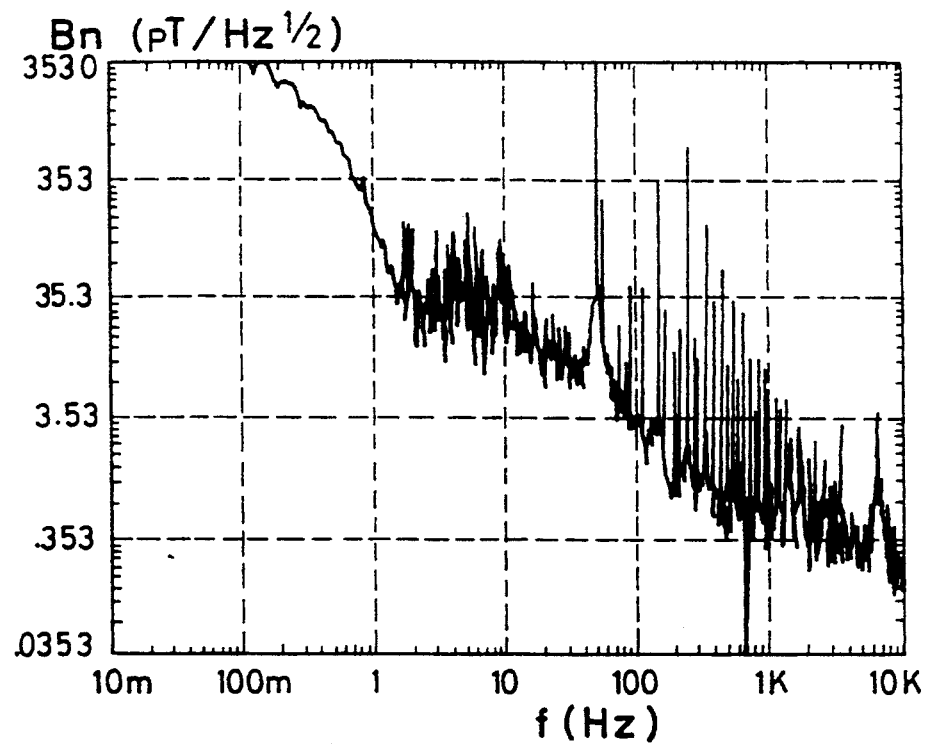
FIGS. 2(A) and 2(B) are schematically illustrated spectra of the magnetic noise measured at the central space of a device according to the invention respectively when the device is not operating and when it is operating.
Figure 2B:
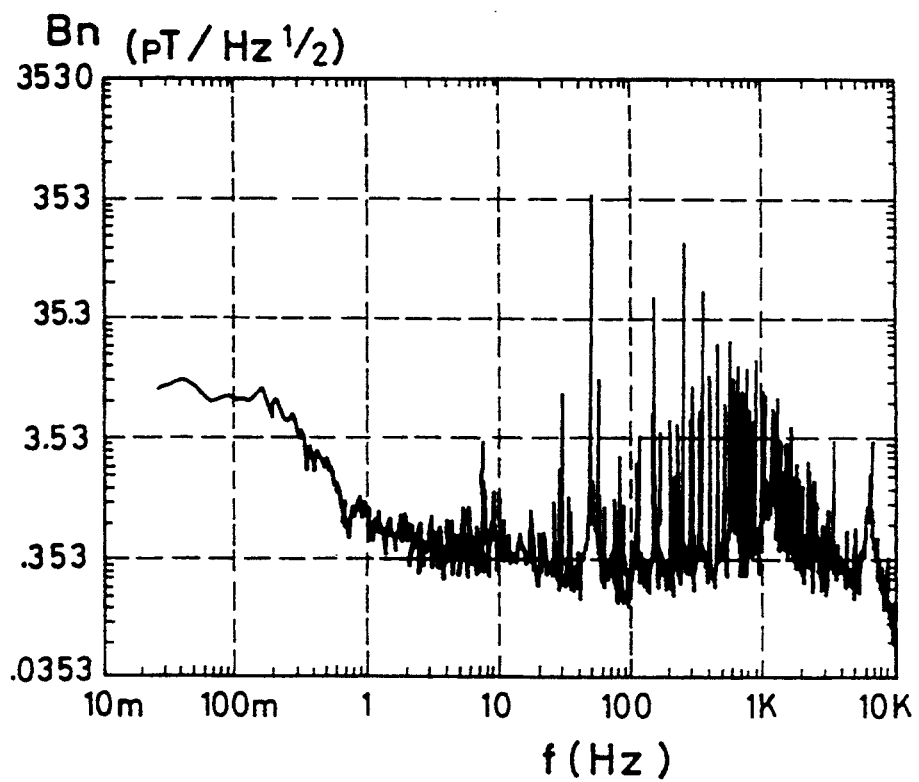

FIGS. 2(A) and 2(B) schematically show the results of measurement in the above described experiment using a separate SQUID flux meter 5 (not shown). The measured frequency range was from 10 mHz to 10 kHz. In FIGS. 2(A) and 2(B), there are shown the magnetic noise spectra of the embodiment of FIG. 1(A) obtained in the above experiment respectively when the active magnetic shield was not activated and when it was activated.

As is apparent from the above results of measurement, the shielding effect of the embodiment is conspicuous below 100 Hz, the magnetism damping factors for 0.5 Hz, 1 Hz, 10 Hz, 50 Hz and 100 Hz being respectively 900, 700, 120, 25 and 14.

Figure 3:
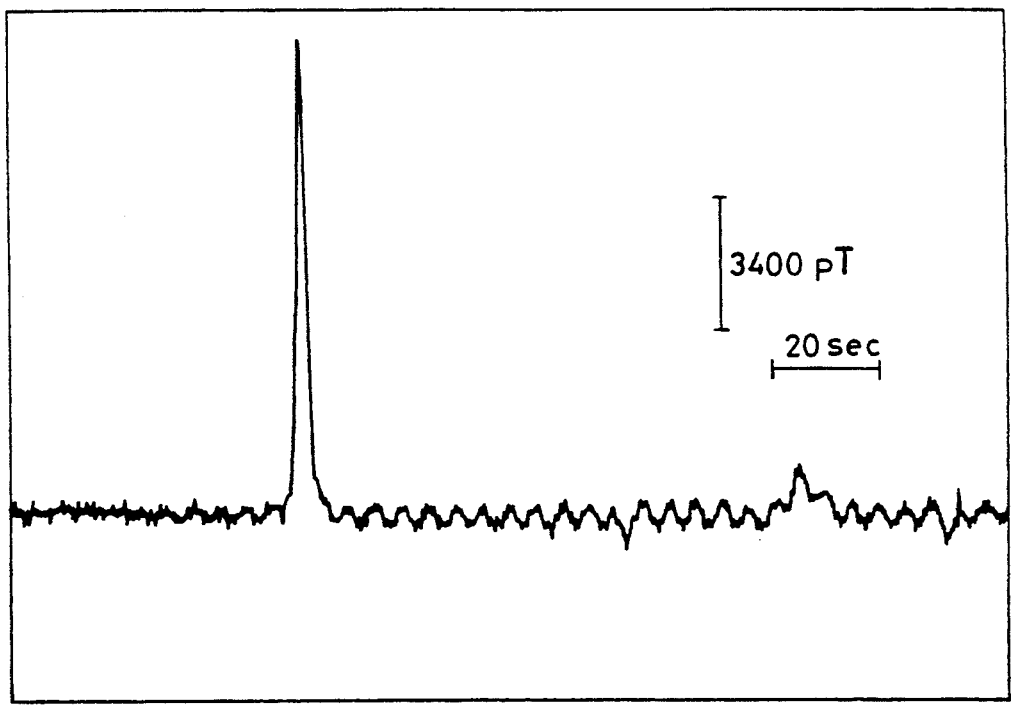
FIG. 3 is a pen-corder graph showing changes with time in the magnetic noise measured at the central space of a device according to the invention when it is not operating.
Figure 4:
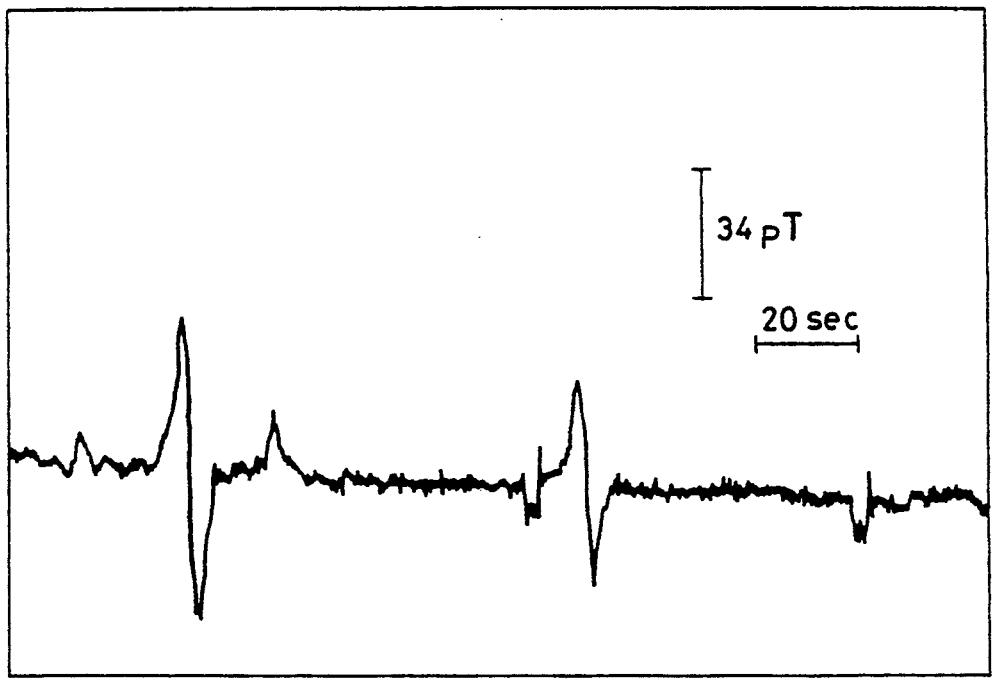
FIG. 4 is a pen-corder graph similar to that of FIG. 3 but recorded when the device is operating.
Figure 5:
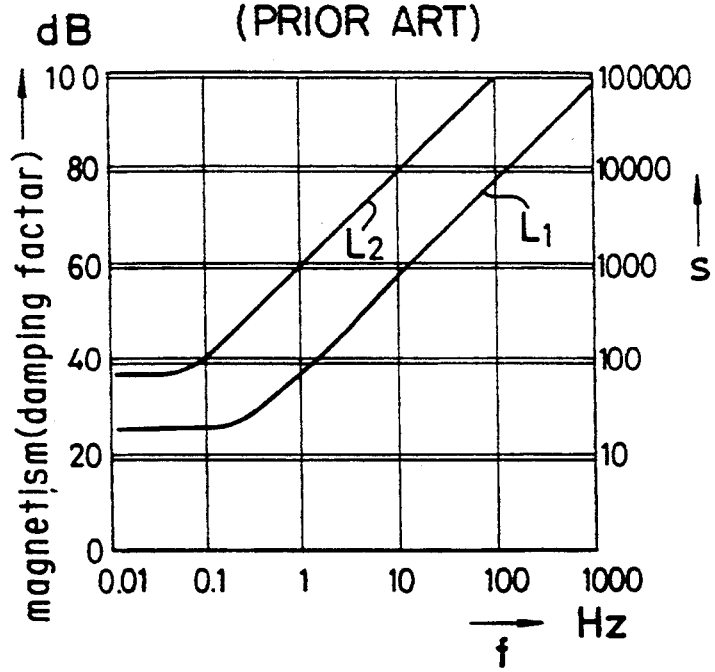
FIG. 5 is a graph showing the relationship between the magnetism damping factor and the frequency of a known magnetic shield room.
Figure 6:
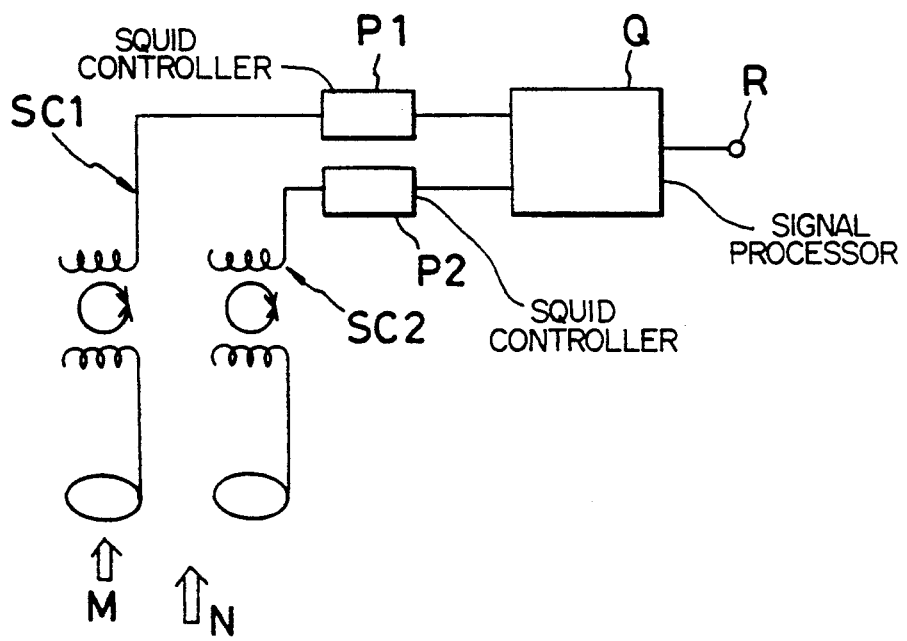
FIG. 6 is a circuit diagram of a known apparatus for electrically canceling magnetic noise.
Figure 7:
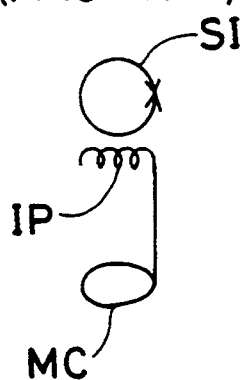
FIG. 7 is a schematic illustration showing the principal components of a known SQUID flux meter.

FIGS. 3 and 4 show the results of measurement using a pen-corder, the former being a record chart obtained when the active shield system was not activated, the latter being a chart obtained when the system was activated.

The magnetic noise levels having a magnitude of several to tens of nT as shown in FIG. 3 represent a noise generated when an automobile passed on a nearby road. FIG. 4 shows that the peak level of such a noise can be reduced to less than 100 pT, proving that the embodiment has an active shield factor greater than 100.

It was found later that the magnetic flux detecting coil 3 and the Helmholtz coils had been displaced from their respective proper positions during the measurement. From this fact, the embodiment can be expected to show a magnetism damping factor much greater than 100 with respect to the average magnetic field in low frequency range for an even magnetic field if the circuit constants, the positional displacement of the coils and the sameness of the Helmholtz coils are improved.

It was also found that the use of a magnetic noise reducing device according to the invention and a conventional magnetic shield room having a simple construction as describe earlier in combination provides a remarkable noise reducing effect which is particularly useful for the measurement of biomagnetism.

As is apparent from the above description, a magnetic noise reducing device according to the invention that comprises SQUID flux meters and noise canceling coils can produce a given space defined by the noise canceling coils that has a remarkable magnetic noise reducing effect particularly against magnetic noise of low frequency range.

Besides, since a magnetic noise reducing device according to the invention can cancel net environmental magnetic noise within the magnetic space where the magnetic flux detecting coils are located, it is particularly useful for simultaneous multiple-point measurement of biomagnetism.

Since a magnetic noise reducing device according to the invention can comprise any appropriate number of SQUID flux meters and noise canceling coils for effectively reducing magnetic noise, it provide an effective method of magnetic noise reduction that does not involve the use of a costly magnetism shield room or a gradiometer of higher order that can be realized at the cost of sensitivity of the SQUID flux meter it comprises.

What is claimed is:

1. A magnetic noise reducing device comprising an appropriate number of noise canceling coils and corresponding matching SQUID flux meters each having a magnetic flux detecting coil arranged within a specific space defined between the corresponding noise canceling coils, the output of each of said SQUID flux meters being supplied to said corresponding noise canceling coils as a feedback current to thereby isolate each of the magnetic flux detecting coils from the effects of any external magnetic noise.

2. A magnetic noise reducing device according to claim 1, wherein each of said corresponding noise canceling coils comprises two distinct, coaxial coils spaced apart from one another to define said specific space, each of said magnetic flux detecting coils being coaxially arranged between the distinct, coaxial coils of said corresponding noise canceling coils.

3. A magnetic noise reducing device according to claim 2, wherein said appropriate number of noise canceling coils is three, and wherein each of the magnetic flux detecting coils and the corresponding noise canceling coils are arranged orthogonally with respect to the other magnetic flux detecting coils and corresponding noise canceling coils.

4. A magnetic noise reducing device according to claim 1, and further comprising a preamplifier, a SQUID controller, and a voltage-current converter, for each SQUID flux meter and connected in series from a corresponding one of said SQUID flux meters to the corresponding noise reducing coils.

* * * * *